United States Patent [19]
Yamada et al.

[11] Patent Number: 5,554,448
[45] Date of Patent: Sep. 10, 1996

[54] WIRE FOR NB$_3$X SUPERCONDUCTING WIRE

[75] Inventors: Yuichi Yamada; Naoki Ayai, both of Osaka, Japan

[73] Assignee: Sumitomo Electric Industries, Ltd., Japan

[21] Appl. No.: 201,281

[22] Filed: Feb. 17, 1994

[30] Foreign Application Priority Data

Feb. 22, 1993 [JP] Japan .................................. 5-032114

[51] Int. Cl.$^6$ ................................................. H01B 12/10
[52] U.S. Cl. ..................... 428/612; 428/614; 428/662; 428/930; 505/813; 505/814; 505/920
[58] Field of Search ................................ 428/930, 662, 428/614, 686, 601, 612, 609; 505/812, 813, 814, 920

[56] References Cited

U.S. PATENT DOCUMENTS

| | | | |
|---|---|---|---|
| 3,570,118 | 3/1971 | Reynolds et al. | 428/930 |
| 3,625,662 | 12/1971 | Roberts et al. | 428/930 |
| 3,665,595 | 5/1972 | Tanaka et al. | 505/920 |
| 3,813,764 | 6/1974 | Tanaka et al. | 425/930 |
| 3,996,661 | 12/1976 | Ziegler et al. | 505/920 |
| 4,003,762 | 1/1977 | Ceresara et al. | 148/11.5 R |
| 4,285,740 | 8/1981 | Young et al. | 505/920 |
| 4,791,241 | 12/1988 | Ando et al. | 428/930 |

FOREIGN PATENT DOCUMENTS

| | | | |
|---|---|---|---|
| 0124708 | 11/1984 | European Pat. Off. | |
| 2265159 | 10/1975 | France. | |
| 56-52807 | 5/1981 | Japan | 428/930 |
| WO92/20076 | 11/1992 | WIPO | 428/930 |

OTHER PUBLICATIONS

R. Bruzzese et al., "Towards a Mo$_3$Al Multifilamentary Cable", 6th International Conference on Magnetic Technology, Brutislava, Czechoslavakia, (29 Aug.–2 Sep., 1977) pp. 1017–1020.

K. Tachikawa et al., "Composite–Processed Nb$_3$Sn with Titanium addition to the Matrix", J. Appl. Phys. 53(7), Jul. 1982, pp. 5354–5355.

Y. Koike et al., "Fabrication of Multifilament Nb$_3$n conductors", Appl. Phys. Letters, vol. 29, No. 6, 15 Sep. 1976, pp. 384–385.

Metals Handbook, 9th Ed., vol. 2, 1979 (no month), "Niobium, Tantalum", pp. 777–779, 799–804.

Patent Abstracts of Japan; vol. 016, No. 397 (E–1252)24 Aug. 1992 & JP–A–04 132 108 (Sumitomo Electric Industries Ltd.) 6 May 1992.

Sumitomo Denki, No. 139, Sep. 1991, pp. 93–100.

*Primary Examiner*—John Zimmerman
*Attorney, Agent, or Firm*—Pennie & Edmonds

[57] ABSTRACT

Disclosed herein is a wire for an Nb$_3$X superconducting wire, which is improved in workability and soundness of a diffusion barrier layer without increasing the diffusion barrier layer in thickness. This wire for an Nb$_3$X superconducting wire comprises a wire which is prepared by superposing and winding up a first sheet consisting of pure Nb or an Nb alloy and a second sheet consisting of metal atoms X, reacting with Nb for forming a compound exhibiting superconductivity, or an X alloy, a stabilizing material layer which is provided to enclose the wire, and a diffusion barrier layer which is provided between an outer surface of the wire and an inner surface of the stabilizing material layer for preventing the metal atoms X from being diffused in the stabilizing material layer, and the diffusion barrier layer is made of a metal material having larger tensile strength than that of the first sheet. It is possible to obtain a high-performance Nb$_3$X superconducting wire having a high critical current density and a large residual resistance ratio of the stabilizing material, by heat treating this wire.

16 Claims, 8 Drawing Sheets

Nb-Al BINARY ALLOY PHASE DIAGRAM

WIRE FOR NB₃X SUPERCONDUCTING WIRE

BACKGROUND OF THE INVENTION

1. Field of the Invention

The present invention relates to a wire for an $Nb_3X$ superconducting wire, and more particularly, it relates to a wire for an $Nb_3X$ superconducting wire which is employed as a high magnetic field superconducting material such as a superconducting magnet for a nuclear fusion reactor or the like.

2. Description of the Background Art

In general, an $Nb_3X$ superconducting material such as $Nb_3Al$, $Nb_3Sn$ or $Nb_3Ge$ is expected as a superconducting material since the same is applicable to a high magnetic field use, which cannot be satisfied by an alloy superconducting material such as NbTi. In particular, an $Nb_3Al$ superconducting material is expected as a useful superconducting material for a nuclear fusion reactor which receives high magnetic force in a high magnetic field, or a superconducting material for power storage, due to a high critical current and excellent stress-strain effect in a high magnetic field.

In general, it is difficult to plastically work such an $Nb_3X$ superconducting material, which is extremely hard and brittle as compared with an alloy superconducting material such as NbTi. Thus, various studies have generally been made on a method of preparing such an $Nb_3X$ superconducting material.

FIG. 10 is an Nb-Al binary alloy phase diagram.

Referring to FIG. 10, $Nb_3Al$ stably exists under a high temperature of at least 1600° C. with a stoichiometric composition ratio of Nb to Al of 3:1. Under a low temperature of less than 1600° C., however, the $Nb_3Al$ is formed with mixture of $Nb_2Al$, which is a non-superconducting material. Therefore, an $Nb_3Al$ compound superconducting material which is prepared at a low temperature of less than 1600° C. has a low critical temperature, a low critical magnetic field (Hc) and a low critical current density (Jc) in general. Thus, no method of preparing an $Nb_3Al$ superconducting material has been put into practice although there has been studied a quenching method of cooling the material from a high temperature of at least 1600° C. in a short time or the like.

However, it has recently been recognized that excellent $Nb_3Al$ is formed in a portion having a short diffusion length of Al atoms in an Nb layer and/or a portion having a short diffusion length of Nb atoms in an Al layer, even if the temperature is not more than 1000° C. To this end, there have been developed production methods such as powder metallurgy (PM), composite working such as a tube method and clad chip extrusion, and a jelly roll method. Every one of these methods is adapted to mix pure Nb or an Nb alloy with pure Al or an Al alloy in an extremely fine state, and can increase the aforementioned portion having a short diffusion length. According to such a method, therefore, it is possible to obtain a high-performance $Nb_3Al$ superconducting material having a stoichiometric composition ratio of Nb to Al which is close to 3:1, with a high critical temperature, a high critical magnetic field (Hc) and a high critical current density (Jc).

Among the aforementioned preparation methods, the jelly roll method can advantageously prepare a superconducting wire having a multifilamentary structure, compose a stabilizing material, and easily prepare a long material. Thus, this is the most practicable method of preparing an $Nb_3Al$ superconducting wire.

The jelly roll method is now described with reference to FIG. 11.

FIG. 11 is a process drawing showing a method of preparing an $Nb_3Al$ superconducting multifilamentary wire in accordance with the jelly roll method.

Referring to FIG. 11, a high-purity Nb sheet and a high-purity Al sheet are first prepared by melting and rolling. Then, the Nb sheet and the Al sheet are superposed with each other and wound on an oxygen free copper rod, to prepare a core (jelly roll). Then, this wire is inserted in an oxygen free copper pipe and drawn into a hexagonal shape in section, and thereafter cut into a desired length to prepare a hexagonal segment 150. Then, a plurality of such hexagonal segments 150 are filled in a copper pipe to prepare a billet, which in turn is sealed up in a vacuum by electron beam welding, and subjected to extrusion. Then, the as-formed multifilamentary wire is drawn and twisted, shaped, stranded and insulated at desire, coiled and thereafter heat treated to form a superconducting phase (A15 structure of $Nb_3Al$). The aforementioned jelly roll method is described in more detail in Sumitomo Denki, No. 139, September 1991, pp. 93–100.

In order to form $Nb_3X$ having excellent superconductivity by such a jelly roll method, it is necessary to maximize the amount of working such as drawing for reducing the sectional area and reduce first and second sheets in thickness, for increasing the amount of the aforementioned portion having a short diffusion length.

Thus, an $Nb_3X$ superconducting wire prepared by the jelly roll method comprises a wire which is formed by superposing and winding up a first sheet consisting of Nb or an Nb alloy and a second sheet consisting of metal atoms X, which react with Nb for forming a superconductive compound, or an X alloy, and a stabilizing material layer which is so provided as to enclose the wire, and the first and second sheets are worked to be extremely small in thickness respectively. The stabilizing material is prepared from copper or a copper alloy, for example.

When such an $Nb_3X$ superconducting wire prepared by the jelly roll method is heat treated to form $Nb_3X$, however, the metal atoms X are thermally diffused as impurities into the copper or the copper alloy which is employed as a stabilizing material and react with the copper atoms to form a compound. Thus, a residual resistance ratio of the $Nb_3X$ superconducting wire is disadvantageously deteriorated.

In order to solve the aforementioned problem, there has been proposed a wire for an $Nb_3X$ superconducting wire having a diffusion barrier layer which is provided between an outer surface of a wire prepared by superposing and winding up first and second sheets and an inner surface of a stabilizing material layer for preventing metal atoms X from diffusion into the stabilizing material. In such a wire for a superconducting wire, the diffusion barrier layer is generally formed by the first sheet which consists of pure Nb or an Nb alloy. Namely, the first sheet is prepared from a sheet which is longer than the second sheet along the direction of winding so that the same is superposed and wound up with the second sheet to form a laminate portion, and the remaining portion of the first sheet is further wound on the outer surface of the laminate portion, to form the diffusion barrier layer.

When a core which is formed by superposing and winding up the first and second sheets is worked to be reduced in sectional area, however, the diffusion barrier layer may also be reduced in thickness such that the same cannot sufficiently serve its function after the degressive working. The thickness of the diffusion barrier layer depends on factors such as the heat treatment situation and the diffusion coefficient of the material therefor, while it has been regarded preferable that its thickness is at least 1 μm after the degressive working. When the diffusion barrier layer is increased in thickness, however, the sectional area of the $Nb_3X$ superconducting wire per sectional area of a non-copper part is relatively reduced to disadvantageously reduce the critical current density (Jc).

SUMMARY OF THE INVENTION

An object of the present invention is to provide a wire for a superconducting wire for obtaining an excellent $Nb_3X$ superconducting wire having a higher critical current density (Jc) and a larger residual resistance ratio of a stabilizing material as compared with a conventional $Nb_3X$ superconducting wire without particularly increasing a diffusion barrier layer in thickness.

According to an aspect of the present invention, a wire for an $Nb_3X$ superconducting wire is obtained. This wire comprises a wire which is prepared by superposing and winding up a first sheet consisting of pure Nb or an Nb alloy and a second sheet consisting of metal atoms X, which react with Nb for forming a compound exhibiting superconductivity, or an X alloy, a stabilizing material layer which is so provided as to enclose the wire, and a diffusion barrier layer which is provided between an outer surface of the wire and an inner surface of the stabilizing material layer for preventing the metal atoms X from being diffused in the stabilizing material layer, and the diffusion barrier layer is made of a metal material having larger tensile strength than that of the first sheet.

According to another aspect of the present invention, a plurality of the aforementioned wires are embedded in a matrix as filaments, to obtain a wire an $Nb_3X$ superconducting multifilamentary wire.

Preferably, the interface between the first and second sheets is densely zigzagged to increase the contact area therebetween.

Preferably, the metal material is prepared from an Nb alloy, which is so composed as to have larger tensile strength than that of the first sheet.

Preferably, the Nb alloy is an alloy which is selected from NbZr, NbTi and NbHf.

Preferably, this alloy contains 0.02 to 5 percent by weight of Zr, Ti or Hf in a single or composite state.

Preferably, the metal atoms X are prepared from a metal which is selected from Al, Sn and Ge.

In the inventive wire for an $Nb_3X$ superconducting wire, the diffusion barrier layer is prepared from a metal material which has larger tensile strength than that of the first sheet consisting of pure Nb or an Nb alloy.

The first sheet consisting of pure Nb or an Nb alloy itself has small deformation resistance, while its tensile strength is so small that the same is easily splintered or orange-peeled during working such as drawing for reducing the sectional area, due to extremely small pinholes which are unavoidably contained therein. In preparation of a conventional wire for an $Nb_3X$ superconducting wire, therefore, a core which is prepared by superposing and winding up first and second sheets is ununiformly deformed or broken during working for reducing the sectional area.

According to the present invention, on the other hand, the diffusion barrier layer is prepared from a metal material having larger tensile strength than that of the first sheet, whereby the core is improved in workability to hardly cause breaking during working for reducing the sectional area. Thus, it is possible to work the respective ones of the first and second sheets to be reduced in thickness, thereby increasing a portion having a short diffusion length. Consequently, it is possible to facilitate reaction for forming a compound exhibiting excellent superconductivity, which contains Nb and X in a stoichiometric composition ratio of about 3:1, in a heat treatment step for forming $Nb_3X$.

According to the present invention, therefore, it is possible to provide a wire for obtaining an $Nb_3X$ superconducting wire having a high critical current density with no reduction in critical current density in an apparent non-copper part without particularly increasing the diffusion barrier layer in thickness, by preventing the metal atoms X from being thermally diffused into the stabilizing material layer.

The metal material for the diffusion barrier layer is prepared from an Nb alloy which is so composed as to have larger tensile strength than that of the first sheet, whereby the diffusion barrier layer has a uniform thickness in any portion along the circumferential direction of the core. Consequently, it is possible to reduce contamination of the stabilizing material layer caused by the metal atoms X in a step of heat treatment for forming $Nb_3X$, thereby obtaining an $Nb_3X$ superconducting wire having a high residual resistance ratio of the stabilizing material layer.

Further, the interface between the first and second sheets is densely zigzagged to increase the contact area therebetween, whereby the aforementioned portion having a short diffusion length is increased. Therefore, the metal atoms X and Nb atoms are improved in diffusibility, whereby the amount of $Nb_3X$ which is formed by the heat treatment per unit time is increased as compared with the prior art. Thus, it is possible to obtain an $Nb_3X$ superconducting wire having a higher critical current density (Jc) as compared with the prior art.

The Nb alloy which is so composed as to have larger tensile strength than that of the first sheet can be prepared from NbZr, NbTi or NbHf, for example. Zr, Ti and Hf are materials which prevent the so-called orange peel phenomenon in working such as drawing for reducing the sectional area of the Nb itself.

Among the above alloys, particularly NbZr or NbTi is preferable. Zr is not diffused in a Cu layer, while Ti will not contaminate the Cu layer although the same forms a compound with Cu. Both of these elements form uniform alloys with Nb. Further, these alloys are commercially available and advantageous in cost.

Further, the alloy preferably contains 0.02 to 5 percent by weight of Zr, Ti or Hf in a single or composite state. The alloy must contain at least 0.02 percent by weight of such an element, in order to attain an effect of preventing the orange peel phenomenon. If the content of the element exceeds 5 percent by weight, however, the diffusion barrier layer itself is unpreferably reduced in degressive workability.

The inventive wire for an $Nb_3X$ superconducting wire having the aforementioned structure is remarkably improved in workability with reduction of ununiform deformation and breaking which may be caused in working for reducing its sectional area. Even if the wire is so remarkably improved in workability, the diffusion barrier layer is maintained in sufficient soundness. Therefore, it is possible to obtain a high-performance $Nb_3X$ superconducting wire having a high critical current density and a large residual resistance ratio of a stabilizing material, by heat treating the inventive wire for an Nb₃X superconducting wire.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

FIGS. 1 to 7 are diagrams for illustrating a method of preparing an Nb₃Al superconducting multifilamentary wire according to Example 1 of the present invention.

Figure 1:
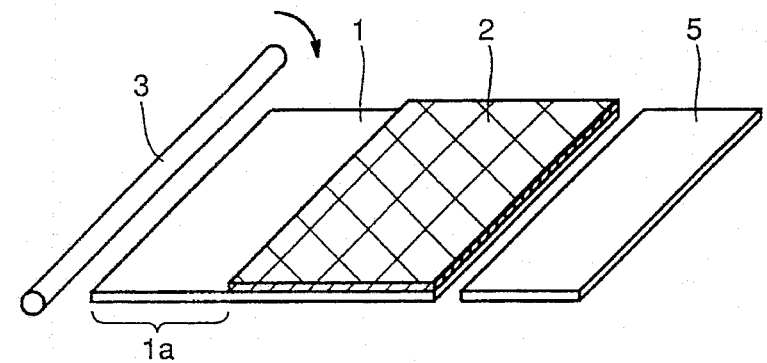
FIG. 1 is a perspective view schematically showing a first step of preparing an Nb₃Al superconducting wire according to Example of the present invention.

Referring to FIG. 1, an Nb sheet 1, consisting of Nb foil (99.8 percent by weight in purity) of 0.18 mm in thickness, 300 mm in width and 600 mm in length, was first prepared by melting and rolling. This Nb sheet 1 was maintained at a temperature 800° C. for about 2 hours. Table 1 shows mechanical properties of the as-obtained Nb sheet 1 after the heat treatment.

TABLE 1

| Mechanical Property | Test Method | Heat-Treated Nb Sheet 1 | Nb-1 wt. % Zr Sheet 5 |
| --- | --- | --- | --- |
| Tensile strength (Kg/mm²) | JISZ2241 | 21 | 26 |
| Hardness (Hv) | JISZ2251 | 72 | 101 |

Then, an Al sheet 2, consisting of Al foil of 0.05 mm in thickness, 300 mm in width and 500 mm in length, was superposed on the surface of the heat treated Nb sheet 1. At this time, one end portion 1a of the Nb sheet 1 was not superposed with the Al sheet 2.

Then, the sheets 1 and 2 were wound on a high-purity copper rod 3 of 3 mm in diameter and 400 mm in length, from the end portion 1a of the Nb sheet 1. Namely, the end portion 1a of the Nb sheet 1 was first wound on the copper rod 3 by four turns, and the superposed portions of the Nb and Al sheets 1 and 2 were thereafter wound thereon. Then, an Nb—1 wt. % Zr sheet 5 of 0.18 mm in thickness, 300 mm in width and 200 mm in length was further wound thereon to prepare a core 6 (see FIG. 2). Table 1 also shows mechanical properties of the as-employed Nb—1 wt. % Zr sheet 5. Thereafter excess portions of the copper rod 3 were removed from both ends thereof by 100 mm in total.

Figure 2:
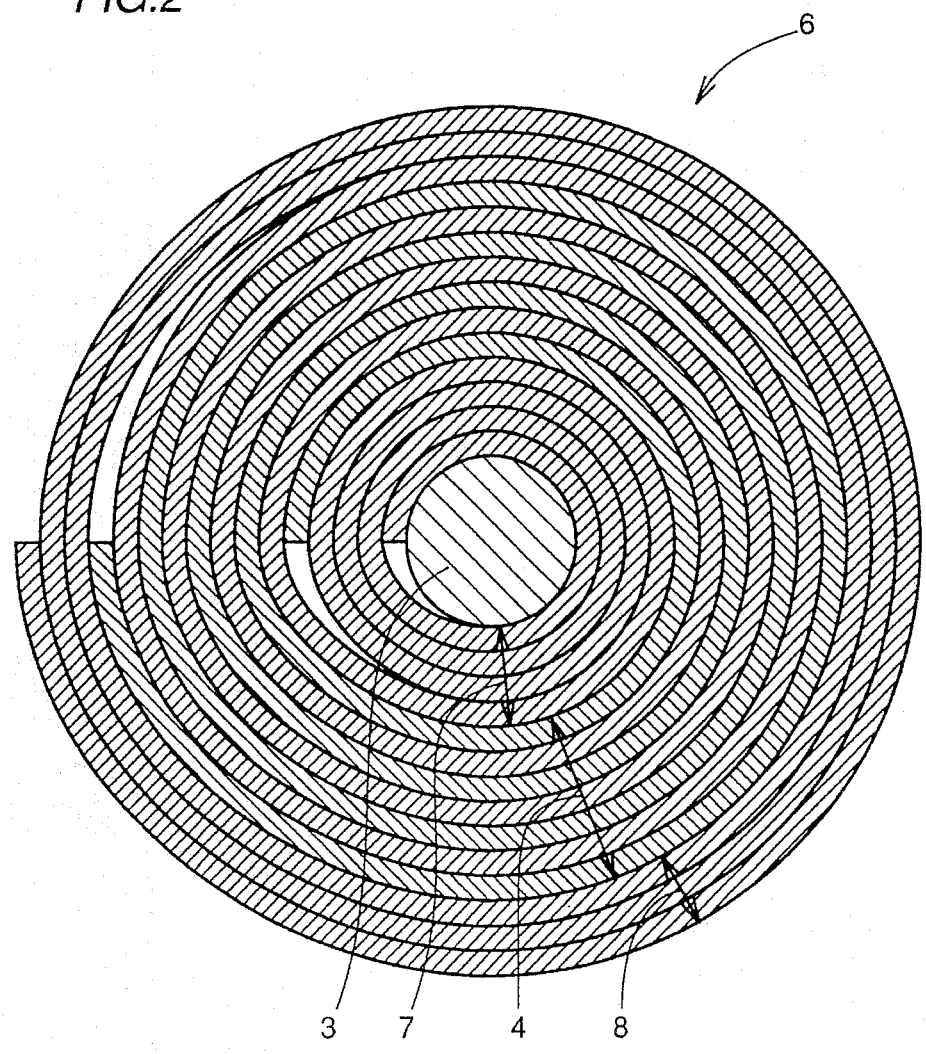
FIG. 2 is a sectional view schematically showing a wire prepared in the step shown in FIG. 1.

FIG. 2 is a sectional view schematically showing the core 6 as obtained.

Referring to FIG. 2, this core 6 was made up by a first diffusion barrier layer 7 which was formed around the centrally located copper rod 3, a laminate portion 4 which was formed around the first diffusion barrier layer 7, and a second diffusion barrier layer 8 which was formed around the laminate portion 4. The first diffusion barrier layer 7 was formed by the end portion 1a of the Nb sheet 1, which was wound by four turns. In the laminate portion 4, on the other hand, the Nb and Al sheets 1 and 2 were wound up in an alternately superposed state. Further, the second diffusion barrier layer 8 was formed by the Nb—1 wt. % Zr sheet 5, which was wound by a plurality of turns.

Figure 3:
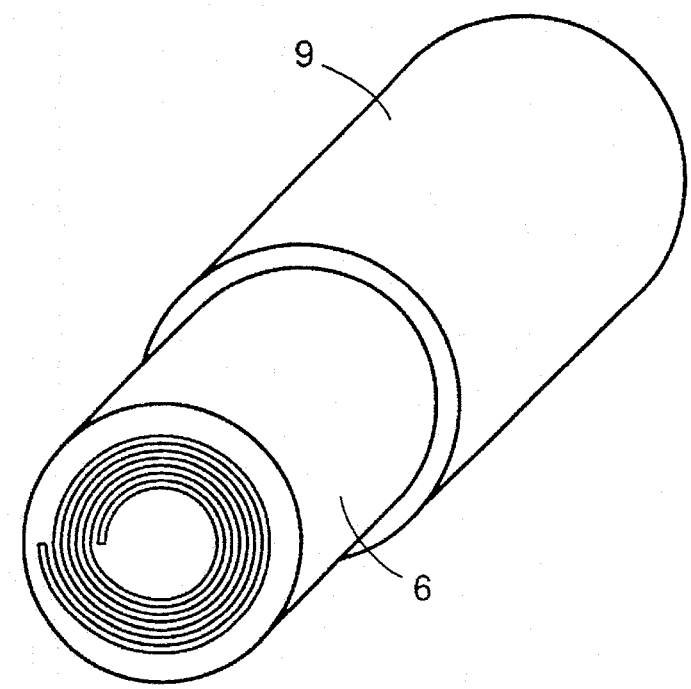
FIG. 3 is a perspective view schematically showing a second step of preparing an Nb₃Al superconducting wire according to Example of the present invention.

Referring to FIG. 3, this core 6 was inserted in a copper pipe 9 of 19 mm in outer diameter and 16 mm in inner diameter, and thereafter drawn to prepare a hexagonal segment 10.

Figure 4:
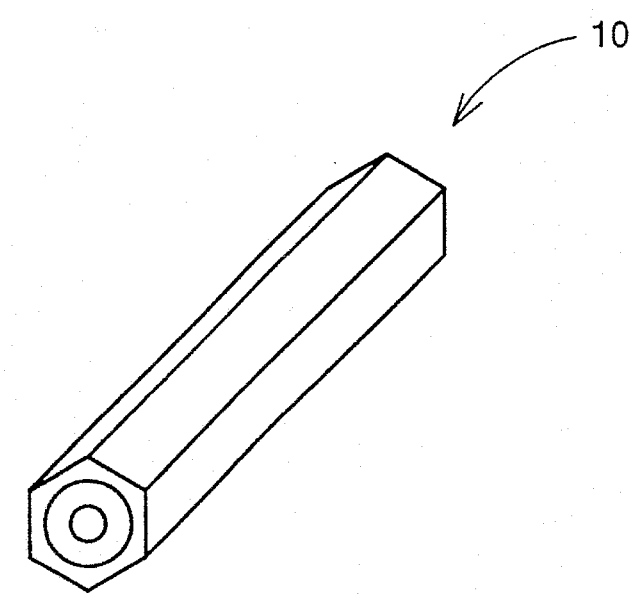
FIG. 4 is a perspective view schematically showing a third step of preparing an Nb₃Al superconducting wire according to Example of the present invention.

FIG. 4 is a perspective view showing the hexagonal segment 10 as obtained.

Referring to FIG. 4, this hexagonal segment 10 had a hexagonal section, with a flat-to-flat distance of 2 mm and a length of 200 mm.

Figure 5:
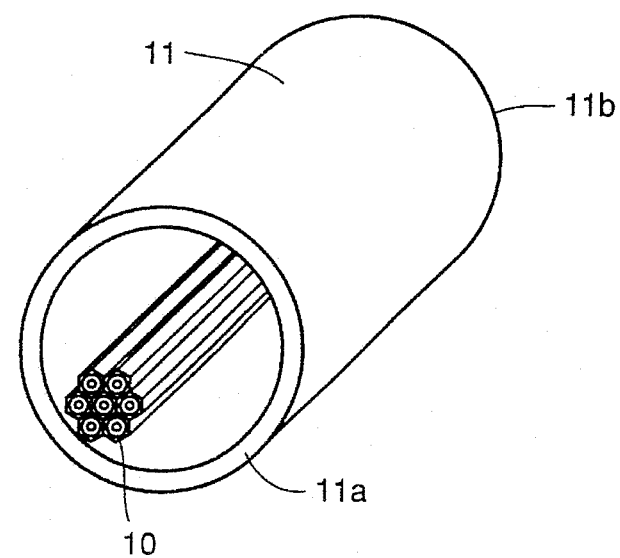
FIG. 5 is a perspective view schematically showing a fourth step of preparing an Nb₃Al superconducting wire according to Example of the present invention.

Referring to FIG. 5, about 800 such hexagonal segments 10 were charged in a copper pipe 11 of 70 mm in outer diameter and 68 mm in inner diameter, and thereafter both ends 11a and 11b of the copper pipe 11 were closed with copper covers (not shown) and sealed by electron beam welding, to prepare a billet (not shown). Then, this billet was extruded and repeatedly drawn to prepare a multifilamentary wire 12 of 1 mm in diameter.

Figure 6:
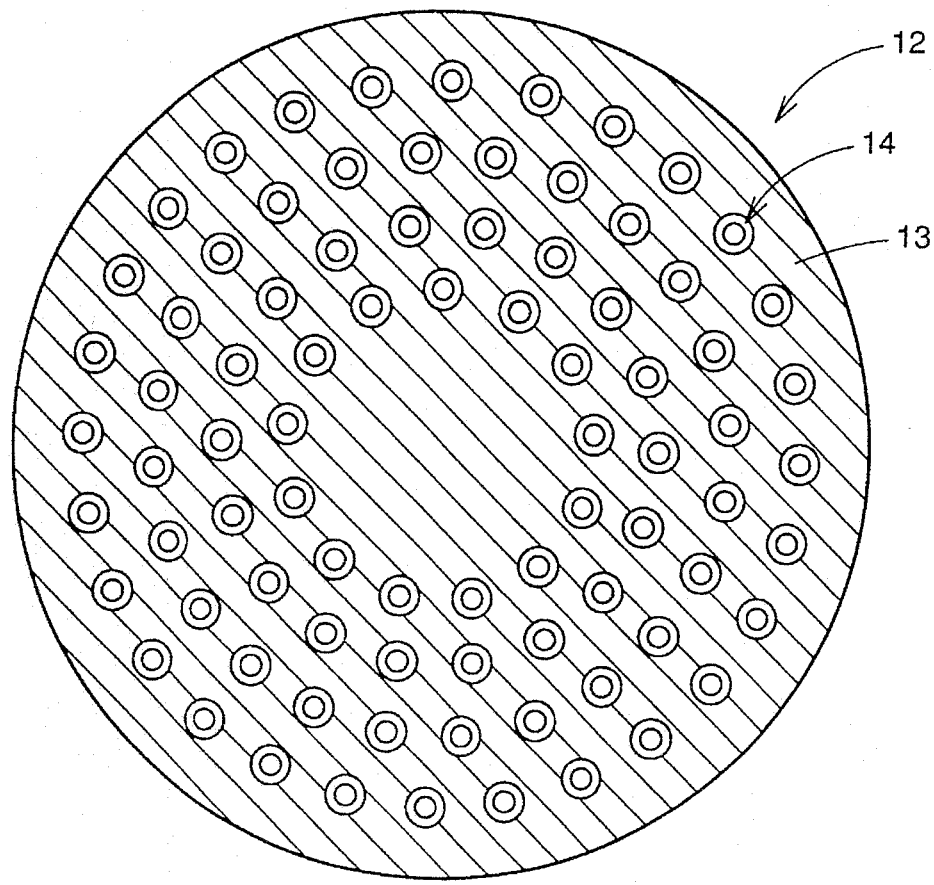
FIG. 6 is a sectional view schematically showing a wire for an Nb₃Al superconducting multifilamentary wire according to Example of the present invention.

FIG. 6 is a sectional view schematically showing the Nb₃Al multifilamentary wire (wire for an Nb₃Al superconducting wire) 12 as obtained.

Referring to FIG. 6, this multifilamentary wire 12 was formed by a matrix (stabilizing material) 13 of Cu and a number of wires 14 consisting of Nb, Al, Nb—1 wt. % Zr and Cu, which were embedded therein.

Figure 7:
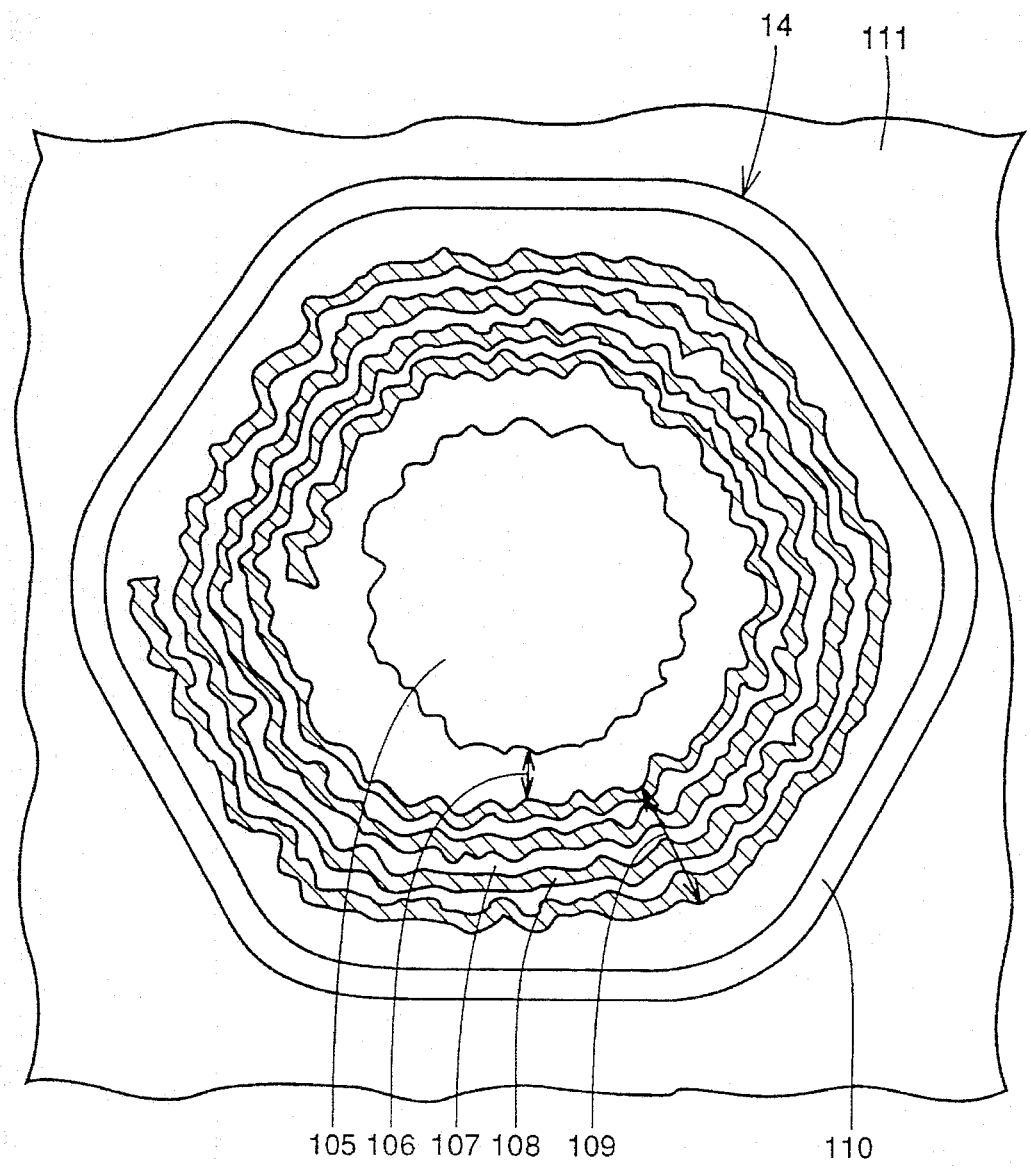
FIG. 7 is an enlarged sectional view schematically illustrating the wire shown in FIG. 6.

FIG. 7 is a model diagram of a microphotograph of 5000 magnifications showing a section of each wire 14.

Referring to FIG. 7, the wire 14 was made up by a first diffusion barrier layer 106 containing Nb, which was formed to enclose the outer surface of a centrally located copper matrix (stabilizing material) 105, a laminate portion 109 which was formed to enclose the first diffusion barrier layer 106, and a second diffusion barrier layer 110 containing Nb, which was formed to enclose the laminate portion 109. Further, another copper matrix (stabilizing material) 111 was formed around the wire 14, to enclose the outer surface of the second diffusion barrier layer 110.

In this wire 14, Nb and Al layers 107 and 108 were alternately spirally formed in the laminate portion 109. The interface between the Nb and Al layers 107 and 108 was densely zigzagged to increase the contact area between the Nb and Al layers 107 and 108. On the other hand, the interface between the second diffusion barrier layer 110 and the copper matrix (stabilizing material) 111 was smoothed. Further, the second diffusion barrier layer 110 which was formed on the outer surface of the laminate portion 109 was so formed that its thickness was substantially uniform in any portion along its circumferential direction.

EXAMPLE 2

A second diffusion barrier layer was formed by an Nb—1 wt. % Zr pipe in place of the Nb—1 wt. % Zr sheet, to prepare a wire for an $Nb_3Al$ superconducting multifilamentary wire similarly to Example 1.

Figure 8:
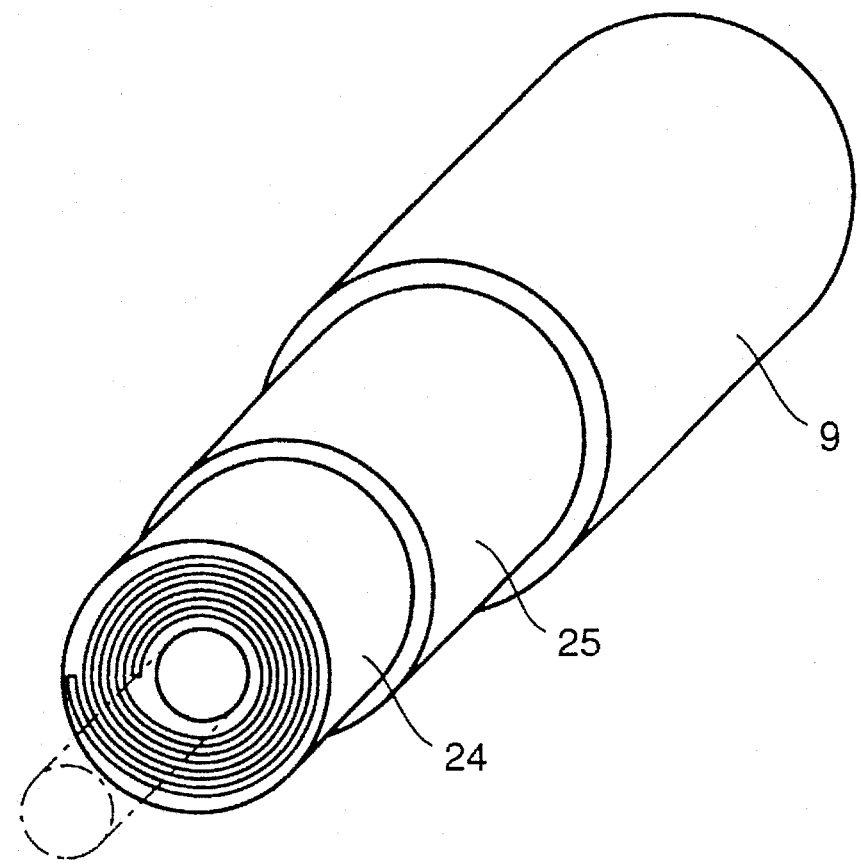
FIG. 8 is a perspective view schematically showing a step of preparing an Nb₃Al superconducting wire according to another Example of the present invention.

Namely, the wire for a superconducting multifilamentary wire was prepared by a hexagonal segment which was obtained by inserting a wire 24 prepared by superposing and winding up an Nb sheet and an Al sheet in an Nb—1 wt. % Zr pipe 25 and further inserting this pipe 25 in a copper pipe 9, as shown in FIG. 8. Other conditions were absolutely similar to those in Example 1, and hence redundant description is omitted.

Table 2 shows mechanical properties of the Nb—1 wt. % Zr pipe 25 employed in Example 2.

TABLE 2

| Mechanical Property | Test Method | Heat-Trated Nb Sheet 1 | Nb-1 wt. % Zr Pipe 25 |
|---|---|---|---|
| Tensile Strength (Kg/mm$^2$) | JISZ2241 | 21 | 28 |
| Hardness (Hv) | JISZ2251 | 72 | 100 |

The wire for a multifilamentary wire as obtained had a sectional shape which was similar to that of the wire for a multifilamentary wire obtained in Example 1 shown in FIGS. 6 and 7.

EXAMPLE 3

A second diffusion barrier layer was formed by an Nb—1 wt. % Ti sheet in place of the Nb—1 wt. % Zr sheet, to prepare a wire for an $Nb_3Al$ superconducting multifilamentary wire similarly to Example 1. Other conditions were absolutely similar to those in Example 1, and hence redundant description is omitted.

Table 3 shows mechanical properties of the Nb—1 wt. % Ti sheet as employed in Example 3.

TABLE 3

| Mechanical Property | Test Method | Heat-Trated Nb Sheet 1 | Nb-1 wt. % Ti Sheet |
|---|---|---|---|
| Tensile Strength (Kg/mm$^2$) | JISZ2241 | 21 | 53 |
| Hardness (Hv) | JISZ2251 | 72 | 142 |

The wire for a multifilamentary wire as obtained had a sectional shape which was similar to that of the wire for a multifilamentary wire obtained in Example 1 shown in FIGS. 6 and 7.

EXAMPLE 4

A second diffusion barrier layer was formed by an Nb sheet which was not heat treated in place of the Nb—1 wt. % Zr sheet, to prepare a wire for an $Nb_3Al$ superconducting multifilamentary wire similarly to Example 1. Other conditions were absolutely similar to those in Example 1, and hence redundant description is omitted.

Table 4 shows mechanical properties of the Nb sheet, which was not heat treated, as employed in Example 4.

TABLE 4

| Mechanical Property | Test Method | Heat-Treated Nb Sheet | Nb Sheet Not Heat-Treated |
|---|---|---|---|
| Tensile Strength (Kg/mm$^2$) | JISZ2241 | 21 | 23 |
| Hardness (Hv) | JISZ2251 | 72 | 95 |

The wire for a multifilamentary wire as obtained had a sectional shape which was similar to that of the wire for a multifilamentary wire obtained in Example 1 shown in FIGS. 6 and 7.

COMPARATIVE EXAMPLE

A first sheet was prepared from Nb foil which was heat treated at a temperature 800° C. for about 2 hours and a second diffusion barrier layer was formed by this first sheet, to prepare a wire for an $Nb_3Al$ multifilamentary superconducting wire, similarly to Example 1. Other conditions were absolutely similar to those in Example 1, and hence redundant description is omitted.

Table 5 shows mechanical properties of the heat-treated Nb sheet employed in comparative example.

TABLE 5

| Mechanical Property | Test Method | Nb Sheet Not Yet Heat-Treated | Heat-Treated Nb Sheet |
|---|---|---|---|
| Tensile Strength (Kg/mm$^2$) | JISZ2241 | (35) | 21 |
| Hardness (Hv) | JISZ2251 | (130) | 72 |

Figure 9:
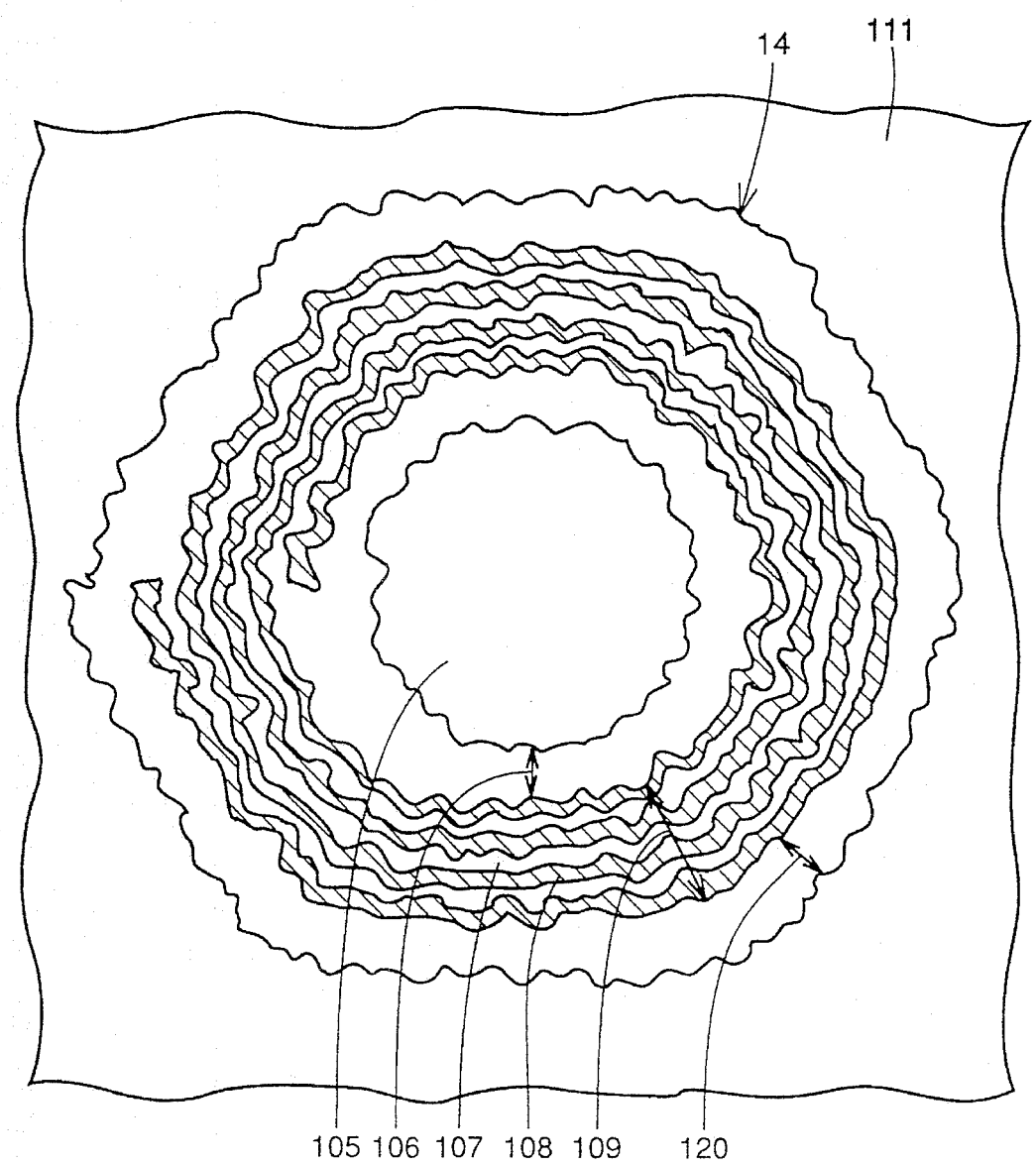
FIG. 9 is a sectional view schematically showing a wire for an Nb₃Al superconducting multifilamentary wire according to comparative example in an enlarged manner.
Figure 10:
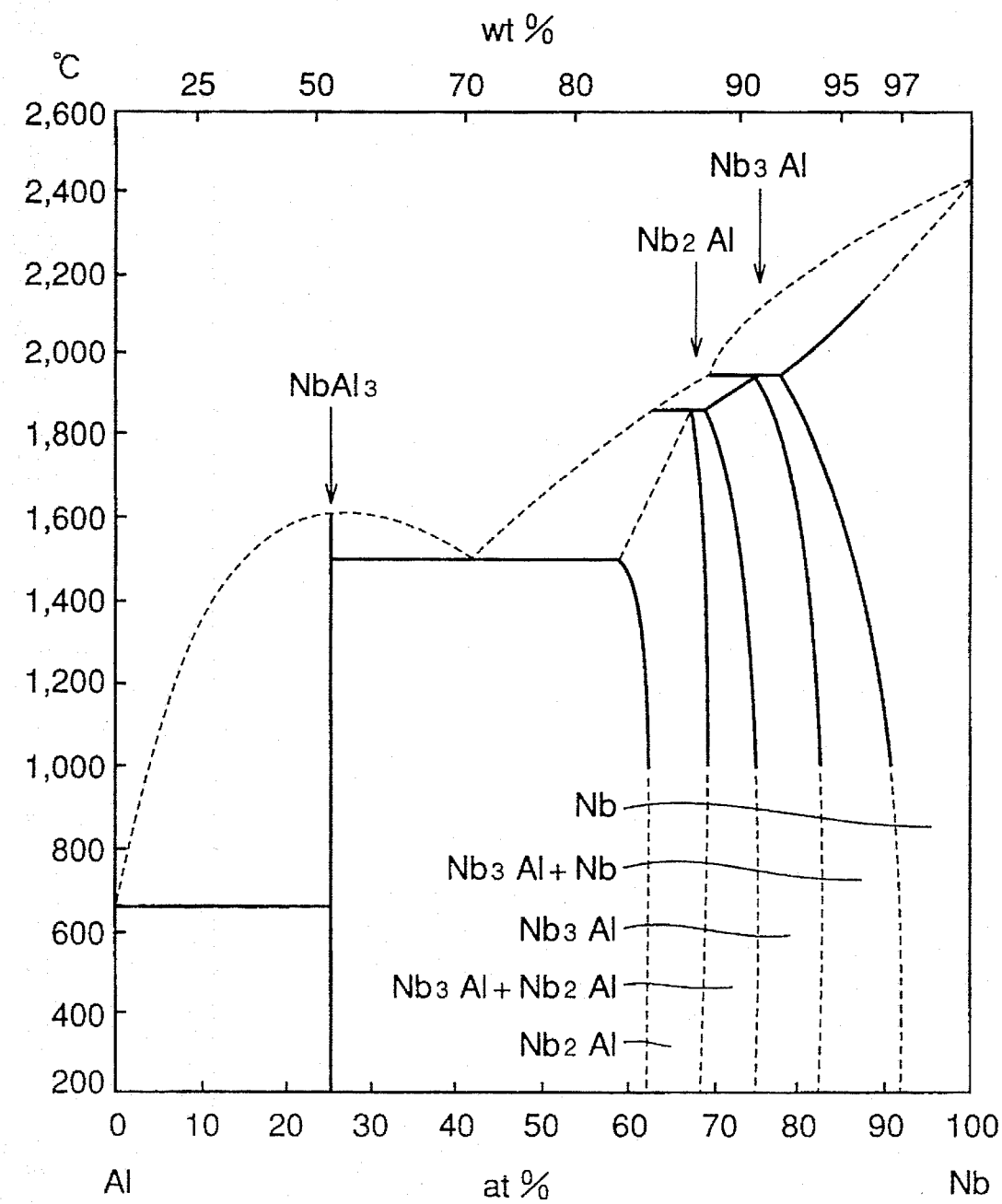
FIG. 10 is an Nb-Al binary alloy phase diagram.
Figure 11:
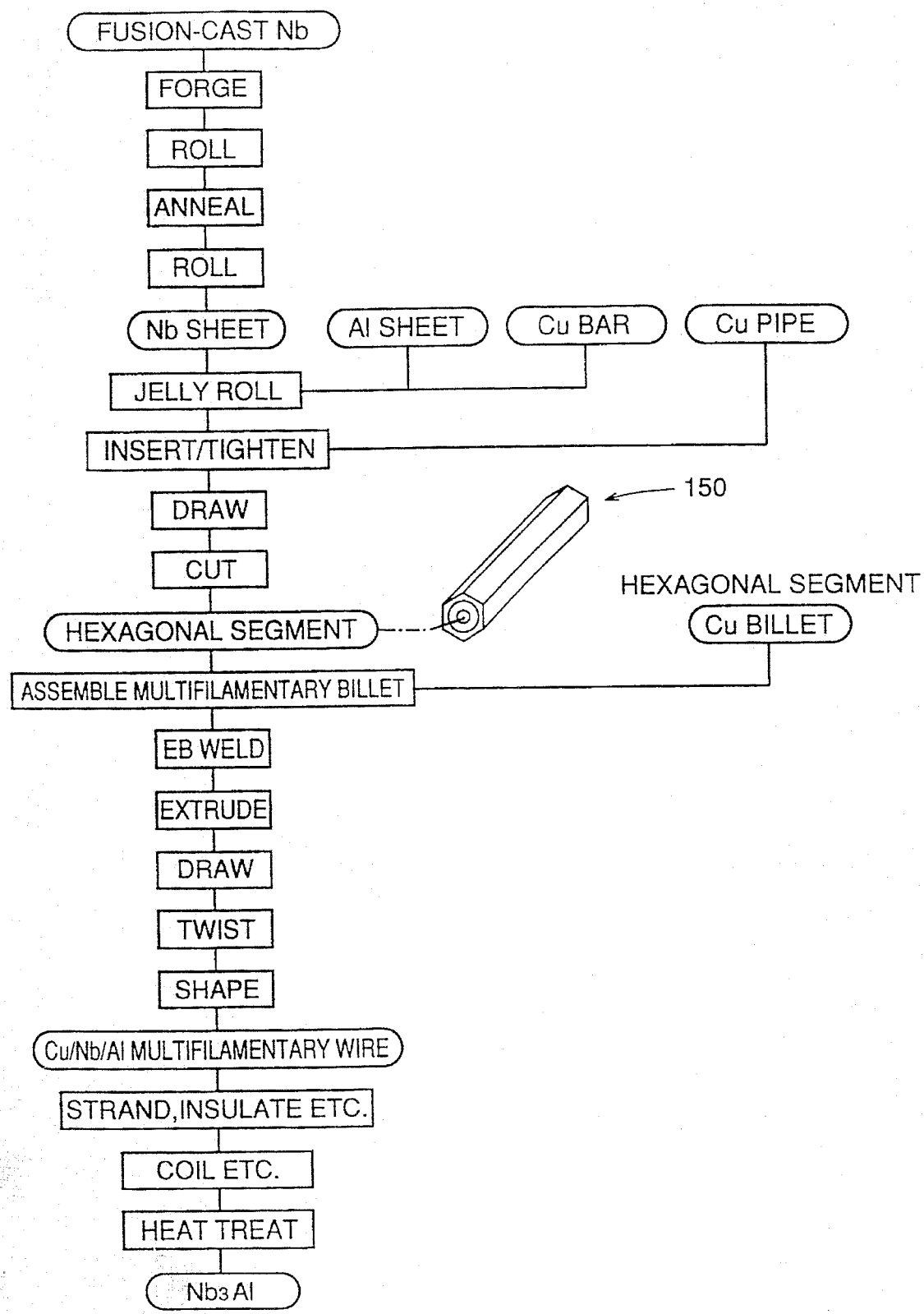
FIG. 11 is a process drawing schematically showing a conventional method of preparing an Nb₃Al superconducting multifilamentary wire according to a jelly roll method.

FIG. 9 is a sectional view schematically showing the as-obtained wire for an $Nb_3Al$ superconducting multifilamentary wire according to comparative example, in an enlarged manner.

Referring to FIG. 9, this wire for a multifilamentary wire had a sectional shape which was similar to that of the wire for a multifilamentary wire according to Example 1 shown in FIG. 7, while the former was different from the latter only in a point that the interface between a second diffusion barrier layer 120 and a copper matrix (stabilizing material) 111 was zigzagged.

SUPERCONDUCTIVITY TEST

The five types of wires obtained in Examples 1 to 4 and comparative example were heat treated at 800° C. for 5 hours to prepare superconducting wires, which were then subjected to measurement of critical current densities (Jc) at 4.2 K and 12 T. Table 6 shows the results. Table 6 also shows frequencies of wire breaking caused before billets of 70 mm in diameter were worked into multifilamentary wires of 1 mm in diameter in preparation of the respective wires.

TABLE 6

| Evaluation Item | Example 1 | Example 2 | Example 3 | Example 4 | Comparative Sample |
|---|---|---|---|---|---|
| Diffusion Barrier Layer | NbZr Sheet | NbZr Pipe | NbTi Sheet | Nb Sheet Not Heat-Treated | Heat-Treated Nb Sheet |
| Frequency of Wire Breaking | 3 Times | 4 Times | 7 Times | 5 Times | 8 Times |
| Jc(12T) | 410 A/mm$^2$ | 390 A/mm$^2$ | 370 A/mm$^2$ | 390 A/mm$^2$ | 350 A/mm$^2$ |
| Residual Resistance Ratio | 190 | 210 | 180 | 180 | 40 |

It is understood from Table 6 that each of the superconducting wires obtained from the wires according to Examples 1 to 4 had a higher critical current density and a larger residual resistance ratio of the Cu matrix which was employed as a stabilizing material, as compared with that obtained by the wire according to comparative example.

In the superconducting wire according to comparative example, the residual resistance ratio of the Cu matrix employed as a stabilizing material was not more than 100. This is because Al atoms were thermally diffused through the diffusion barrier layer to reach the Cu matrix layer in the heat treatment for forming Nb$_3$Al, to contaminate the Cu matrix. On the other hand, the superconducting wire according to each Example exhibited a large residual resistance ratio of the matrix. This is because soundness of the diffusion barrier layer was maintained due to employment of the Nb alloy consisting of Nb—1 wt. % Zr or Nb—1 wt. % Ti and hence contamination of the matrix with Al atoms was reduced in the heat treatment.

According to the present invention, further, the frequency of wire breaking in working for reducing the sectional area is reduced, whereby a longer multifilamentary wire can be easily manufactured.

Referring again to FIG. 7, the second diffusion barrier layer 110 which was formed to enclose the outer surface of the laminate portion 109 was substantially uniformalized in thickness in any portion along its circumferential direction in Example according to the present invention. Further, the interface between the second diffusion layer 110 and the copper matrix (stabilizing material) 111 was so smoothed as to reduce the contact area therebetween, as compared with comparative example shown in FIG. 9. In the heat treatment step for forming Nb$_3$Al, therefore, the Al atoms were prevented from being incorporated in the copper matrix (stabilizing material) 111 as impurities through thermal diffusion. Consequently, the superconducting wire according to Example exhibited a larger residual resistance ratio of the copper matrix (stabilizing material) 111 as compared with that according to comparative example.

According to the present invention, as hereinabove described, the diffusion barrier layer is so soundly formed as to prevent the Cu matrix from contamination with X atoms in the heat treatment step with no particular increase in film thickness, whereby the rate of working for reducing the sectional area can be improved. Thus, the superconducting wire which is prepared from the inventive Nb$_3$X superconducting wire has a higher critical current density and a larger residual resistance ratio of a copper matrix as compared with a conventional superconducting wire.

Further, the interface between the Nb and Al layers is densely zigzagged to increase the contact area therebetween, whereby a higher critical current density (Jc) can be obtained.

The metal atoms X which react with Nb to form a compound exhibiting superconductivity can be prepared from Sn or Ge, for example, in addition to Al employed in the aforementioned Examples. On the other hand, the Nb alloy and/or the X alloy can also contain Ge, Sn, Ti, Si, Hf, Ta, Zr, Mg and/or Be, for example.

While only the second diffusion barrier layer was made of a metal material having larger tensile strength than that of the first sheet in each of Examples 1 to 4, both of the first and second diffusion layers may alternatively be made of the metal material having larger tensile strength than that of the first sheet.

According to the present invention, further, the second diffusion layer can be made of a metal material having the same composition as that for the first sheet, as in Example 4. When the second diffusion barrier layer is prepared from pure Nb, for example, the first sheet may be formed by a pure Nb sheet which is prepared by rolling and heat treated in a temperature range of 700° to 1100° C. for 1 to 10 hours, while the second diffusion barrier layer may be formed by a pure Nb sheet or pipe which is prepared by cold working such as rolling, as such.

The heat-treated pure Nb sheet is reduced in tensile strength and hardness as compared with the pure Nb sheet or pipe which is prepared by cold working such as rolling. In the heat-treated pure Nb sheet, further, crystals are so readjusted that the direction of its sliding surface is substantially non-oriented. In the pure Nb sheet or pipe which is applied to the second diffusion barrier layer, on the other hand, crystals are oriented to some extent in the cold working such as rolling. The step of heat treating the first sheet consisting of pure Nb or an Nb alloy is preferably carried out at a degree of vacuum of 10$^{-5}$ to 10$^{-7}$ Torr.

According to Example 4, the diffusion barrier layer is made of a metal material having higher hardness than the first sheet. Consequently, it is possible to prevent the wire which is prepared by alternately superposing and winding up first and second sheets from ununiform deformation in working for reducing the sectional area. Thus, the wire which is prepared by alternately superposing and winding up first and second sheets is improved in workability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wire for an $Nb_3X$ superconducting wire, comprising:
   a wire being prepared by superposing and winding up a first sheet consisting of pure Nb or an Nb alloy and a second sheet consisting of metal atoms X, reacting with said Nb for forming a compound exhibiting superconductivity, or an X alloy;
   a stabilizing material layer being so provided as to enclose said wire; and
   a diffusion barrier layer being provided between an outer surface of said wire and an inner surface of said stabilizing material layer for preventing said metal atoms X from being diffused in said stabilizing material layer,
   said diffusion barrier layer being made of a metal material having larger tensile strength than that of said first sheet wherein said metal material includes an Nb alloy.

2. A wire for an $Nb_3X$ superconducting wire in accordance with claim 1, wherein said Nb alloy used in said diffusion barrier layer is selected from the group consisting of NbZr, NbTi and NbHf.

3. A wire for an $Nb_3X$ superconducting wire in accordance with claim 2, wherein said alloy comprises 0.02 to 5 percent by weight of an element or a composite of elements being selected from the group consisting of Zr, Ti and Hf.

4. A wire for an $Nb_3X$ superconducting wire in accordance with claim 1, wherein said metal atoms X are prepared from a metal being selected from the group consisting of Al, Sn and Ge.

5. A wire for an $Nb_3X$ multifilamentary superconducting wire being formed by a number of superconducting filamentary wires being embedded in a matrix, each said superconducting filamentary wire comprising:
   a wire being prepared by superposing and winding up a first sheet consisting of pure Nb or an Nb alloy and a second sheet consisting of an X alloy such as that of metal atoms X reacting with said Nb for forming a compound exhibiting superconductivity;
   a stabilizing material layer being so provided as to enclose said wire; and
   a diffusion barrier layer being provided between an outer surface of said wire and an inner surface of said stabilizing material layer for preventing said metal atoms X from being diffused in said stabilizing material layer,
   said diffusion barrier layer being made of a metal material having larger tensile strength than that of said first sheet wherein said metal material includes an Nb alloy.

6. A wire for an $Nb_3X$ superconducting wire in accordance with claim 5, wherein said Nb alloy used in said diffusion barrier layer is selected from the group consisting of NbZr, NbTi and NbHf.

7. A wire for an $Nb_3X$ superconducting wire in accordance with claim 6, wherein said alloy comprises 0.02 to 5 percent by weight of an element or a composite of elements being selected from the group consisting of Zr, Ti and Hf.

8. A wire for an $Nb_3X$ superconducting wire in accordance with claim 5, wherein said metal atoms X are prepared from a metal being selected from the group consisting of Al, Sn and Ge.

9. A wire for an $Nb_3X$ superconducting wire, comprising:
   a wire being prepared by superposing and winding up a first sheet consisting of pure Nb or an Nb alloy and a second sheet consisting of an X alloy such as that of metal atoms X reacting with said Nb for forming a compound exhibiting superconductivity;
   a stabilizing material layer being so provided as to enclose said wire; and
   a diffusion barrier layer being provided between an outer surface of said wire and an inner surface of said stabilizing material layer for preventing said metal atoms X from being diffused in said stabilizing material layer,
   said diffusion barrier layer being made of a Nb alloy having larger tensile strength than that of said first sheet,
   the interface between said first sheet and said second sheet being so densely zigzagged as to increase the contact area therebetween.

10. A wire for an $Nb_3X$ superconducting wire in accordance with claim 9, wherein said Nb alloy used in said diffusion barrier layer is selected from the group consisting of NbZr, NbTi and NbHf.

11. A wire for an $Nb_3X$ superconducting wire in accordance with claim 10, wherein said alloy comprises 0.02 to 5 percent by weight of an element or a composite of elements being selected from the group consisting of Zr, Ti and Hf.

12. A wire for an $Nb_3X$ superconducting wire in accordance with claim 9, wherein said metal atoms X are prepared from a metal being selected from the group consisting of Al, Sn and Ge.

13. A wire for an $Nb_3X$ multifilamentary superconducting wire being formed by a number of superconducting filamentary wires being embedded in a matrix, each said superconducting filamentary wire comprising:
   a wire being prepared by superposing and winding up a first sheet consisting of pure Nb or an Nb alloy and a second sheet consisting of an X alloy such as that of metal atoms X reacting with said Nb for forming a compound exhibiting superconductivity;
   stabilizing material layer being so provided as to enclose said wire; and
   a diffusion barrier layer being provided between an outer surface of said wire and an inner surface of said stabilizing material layer for preventing said metal atoms X from being diffused in said stabilizing material layer,
   said diffusion barrier layer being made of a Nb alloy having larger tensile strength than that of said first sheet,
   the interface between said first sheet and said second sheet being so densely zigzagged as to increase the contact area therebetween.

14. A wire for an $Nb_3X$ superconducting wire in accordance with claim 13, wherein said Nb alloy used in said diffusion barrier layer is selected from the group consisting of NbZr, NbTi and NbHf.

15. A wire for an $Nb_3X$ superconducting wire in accordance with claim 14, wherein said alloy comprises 0.02 to 5 percent by weight of an element or a composite of elements being selected from the group consisting of Zr, Ti and Hf.

16. A wire for an $Nb_3X$ superconducting wire in accordance with claim 13, wherein said metal atom X is prepared from a metal being selected from the group consisting of Al, Sn and Ge.

* * * * *